United States Patent [19]

Kumagai

[11] Patent Number: 5,754,068
[45] Date of Patent: May 19, 1998

[54] CMOS LOGIC LSI HAVING A LONG INTERNAL WIRING CONDUCTOR FOR SIGNAL TRANSMISSION

[75] Inventor: Kouichi Kumagai, Tokyo, Japan

[73] Assignee: NEC Corporation, Tokyo, Japan

[21] Appl. No.: 847,810

[22] Filed: Apr. 25, 1997

[30] Foreign Application Priority Data

Apr. 25, 1996 [JP] Japan .................. 8-105492

[51] Int. Cl.$^6$ .................................. H03K 3/02
[52] U.S. Cl. .................. 327/142; 327/291; 327/298; 327/530
[58] Field of Search .................. 327/142, 143, 327/198, 164, 291, 298, 299, 530, 544, 309, 333, 18, 20, 24; 326/80, 81, 62, 63

[56] References Cited

U.S. PATENT DOCUMENTS

| | | | |
|---|---|---|---|
| 3,333,116 | 7/1967 | Lo Casale | 326/63 |
| 4,988,901 | 1/1991 | Kamuro et al. | 307/518 |
| 5,057,720 | 10/1991 | Hattori | 307/571 |
| 5,136,191 | 8/1992 | Nunogami | 307/475 |

FOREIGN PATENT DOCUMENTS 62-120717 6/1987 Japan .
2-155492 6/1990 Japan .

OTHER PUBLICATIONS

W. C. Elmore, "The Transient Response of Damped Linear Networks with Particular Regard to Wideband Amplifiers", *Journal of Applied Physics*, vol. 19, Jan. 1948, pp. 55–63.

*Primary Examiner*—Timothy P. Callahan
*Assistant Examiner*—An T. Luu
*Attorney, Agent, or Firm*—Young & Thompson

[57] ABSTRACT

In a semiconductor integrated circuit having an internal wiring conductor for transferring an internal signal, an intermediate voltage generator generates an intermediate voltage equal to a half of a power supply voltage, and a driver circuit receives the intermediate voltage and the internal signal, for generating to the internal wiring conductor a positive/negative pulse signal having the intermediate voltage as a reference level, in response to a rising/falling edge of the internal signal. A receiver circuit receives the positive/negative pulse signal transferred through the internal wiring conductor. An output of the receiver circuit is set in response to a positive pulse of the positive/negative pulse signal, and reset in response to a negative pulse of the positive/negative pulse signal.

12 Claims, 6 Drawing Sheets

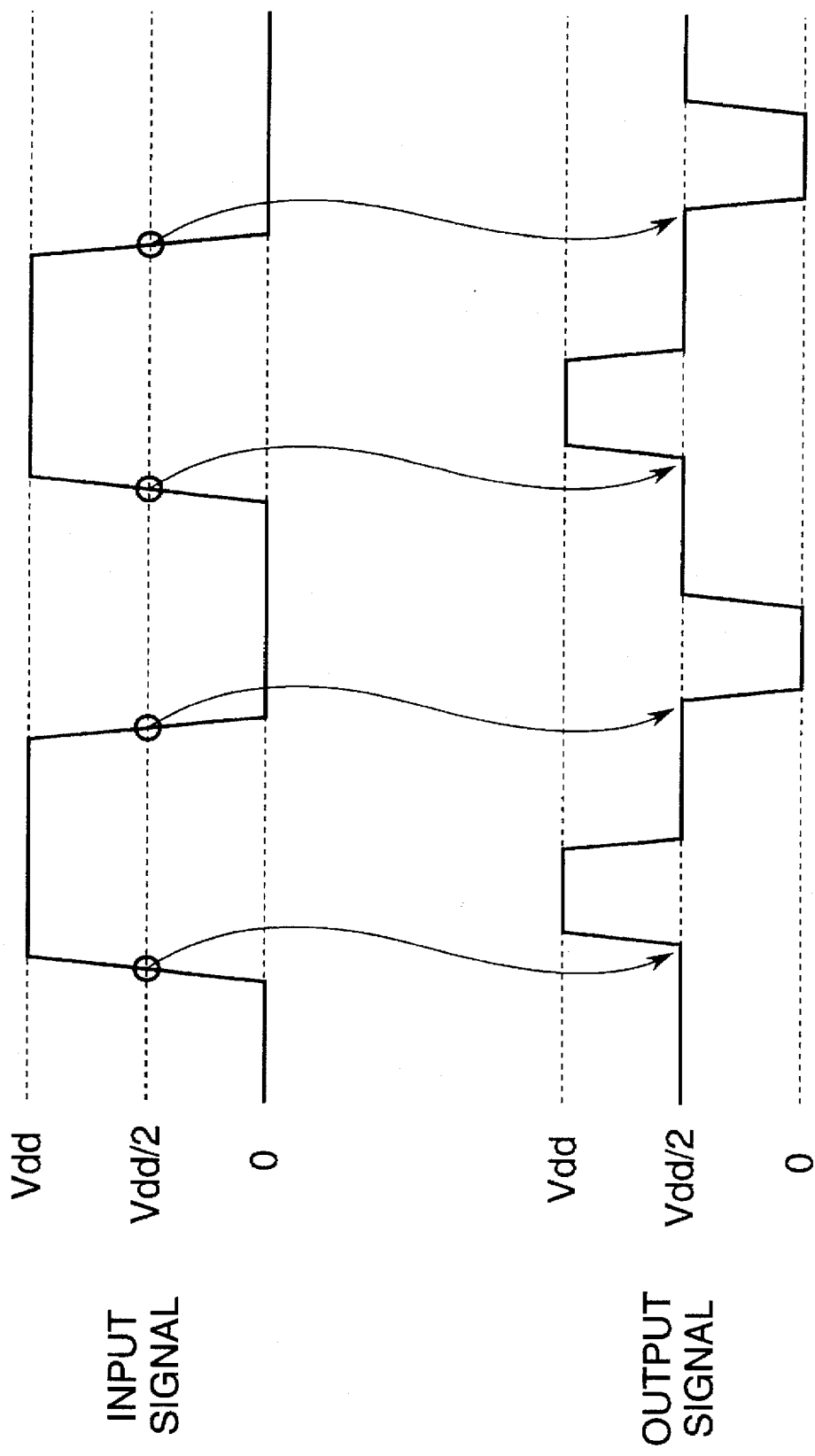

CMOS LOGIC LSI HAVING A LONG INTERNAL WIRING CONDUCTOR FOR SIGNAL TRANSMISSION

BACKGROUND OF THE INVENTION

1. Field of the Invention

The present invention relates to a semiconductor integrated circuit, and more specifically to a CMOS logic LSI having a long internal wiring conductor for an internal signal transmission.

2. Description of Related Art

In an advanced CMOS (complementary MOS) logic LSI (large scale integrated circuit), microminiaturization of circuit elements and wiring conductors is advanced more and more in order to elevate an operation speed and an integration density of circuit elements. In the case of a MOS transistor (metal-oxide-semiconductor field effect transistor), this micro-miniaturization of circuit elements means that a channel length, a gate oxide film thickness and a source/drain diffused region area are reduced, which results in an increased driving capacity of the transistor and in an elevated integrated density. Accordingly, in connection with performance of an individual MOS transistor, a scaling principle holds that the smaller the size of a circuit element becomes, the higher the performance of the circuit element becomes.

On the other hand, microminiaturization of wiring conductors means that the width of an individual wiring conductor and a wiring pitch (interval between each pair of adjacent wiring conductors) are reduced. Therefore, a capacitance of the individual wiring conductor decreases, but a capacitance between adjacent wiring conductors rather increases, with the result that a wiring capacitance increases as a whole. On the other hand, a wiring resistance increases as the result of microminiaturization of wiring conductors. Accordingly, since a propagation delay of a signal occurring on the wiring conductor, namely, a so called "wiring delay", is a monotonic increasing function in connection with the wiring capacitance and the wiring resistance, the wiring delay does not fall under a scaling principle of the wiring conductor size. Because of this reason, with advanced microminiaturization of LSI, a proportion of the wiring delay time to a total signal propagation delay time becomes large.

Referring to FIG. 1, there is shown a circuit diagram of a signal transmission circuit in a prior art CMOS logic circuit. In the circuit shown in FIG. 1, a driver circuit 1 is constituted of two cascaded CMOS inverters 18 and 19 each of which is composed of a PMOS (P-channel MOS) transistor QP and an NMOS (N-channel MOS) transistor QN connected in series between a power supply voltage Vdd and ground. The driver circuit 1 has an input node 11 connected to common-connected gates of the PMOS transistor QP and an NMOS transistor QN of the input stage CMOS inverter 18 and an output node 12 connected to common-connected drains of the PMOS transistor QP and an NMOS transistor QN of the output stage CMOS inverter 19. Thus, a digital signal supplied to the input node 11 is outputted from the output node 12 in the same phase as that of the input signal.

The signal outputted from the output node 12 is transmitted to an input node 31 of a receiver circuit 3 through an internal wiring conductor 2 having a length "L" (mm) and having a capacitance per unitary length "C" (pF/mm) and a resistance per unitary length "R" (Ω/mm).

Similarly to the driver circuit 1, the receiver circuit 3 is also constituted of two cascaded CMOS inverters 38 and 39 each composed of a PMOS transistor QP and an NMOS transistor QN connected in series between the power supply voltage Vdd and the ground. The input node 31 is connected to common-connected gates of the PMOS transistor QP and an NMOS transistor QN of the input stage CMOS inverter 38, and an output node 32 is connected to common-connected drains of the PMOS transistor QP and an NMOS transistor QN of the output stage CMOS inverter 39. Thus, a digital signal supplied to the input node 31 is outputted from the output node 32 in the same phase as that of the input signal.

When a signal changing from a low level to a high level at the input 11 of the driver circuit 1 is transmitted to the output 32 of the receiver circuit 32, an electric charge is supplied to a wiring capacitance Cl of the internal wiring conductor 2 and an input node capacitance Ct of the receiver circuit 3 through the PMOS transistor QP of the output stage CMOS inverter 19 of the driver circuit 1. To the contrary, when a signal changing from the high level to the low level at the input 11 of the driver circuit 1 is transmitted to the output 32 of the receiver circuit 32, an electric charge is extracted or discharged from the wiring capacitance Cl and the input node capacitance Ct through the NMOS transistor QN of the output stage CMOS inverter 19 of the driver circuit 1.

Now, assume that a power supply voltage is Vdd, an output impedance of the driver circuit 1 is Zr (at rising) and Zf (at falling), the wiring resistance of the wiring conductor 2 is Rl, the wiring capacitance of the wiring conductor 2 is Cl, a logical threshold of the receiver circuit 3 is Vt, and the input node capacitance of the receiver circuit 3 is Ct. Under this condition, wiring delays tpdl(r) (at rising) and tpdl(f) (at falling) are expressed by the following equations (1) and (2), respectively.

$$tpdl(r)=\ln\{Vdd/(Vdd-Vt)\}\times\{Zr\times Cl+Rl\times(0.5\times Cl+Ct)\} \quad (1)$$

$$tpdl(f)=\ln(Vdd/Vt)\times\{Zf\times Cl+Rl\times(0.5\times Cl+Ct)\} \quad (2)$$

(See W. C. Elmore, "The Transient Response of Damped Linear Networks with Particular Regard to Wideband Amplifiers", Journal of Applied Physics, Vol.19, No.1, pages 55–63, January 1948)

Here, considering a CMOS process of a gate length of 0.5 μm, which is the present mass production rule, it is assumed that the capacitance per unitary length "C"=0.2 pF/mm, and the resistance per unitary length "R"=50 Ω/mm, the power supply voltage Vdd=3.3 V, the driver circuit output impedance Zr=Zf=400Ω, the receiver circuit logical threshold voltage Vt=1.5 V, the receiver circuit input node capacitance Ct=20 fF. Under this condition, letting the wiring conductor length=3 mm, if the wiring delay is calculated in accordance with the equations (1) and (2), it becomes tpdl(r)=0.17 ns and tpdl(f)=0.22 ns. Similarly, letting the wiring conductor length=10 mm, it becomes tpdl(r)=0.79 ns and tpdl(f)=1.0 ns.

In the 0.5 μm CMOS process, a delay per one inverter gate stage is about 200 ps for a load of a fan-out "1". Therefore, the wiring delay of the wiring conductor length of 3 mm is comparable to the delay of one inverter gate stage, and the wiring delay of the wiring conductor length of 10 mm becomes four or five times the delay of one inverter gate stage.

As mentioned above, when a signal is transmitted through the wiring conductor of not less than 3 mm in a semiconductor device of a gate length of not greater than 0.5 μm, the wiring delay becomes larger than the gate delay. If the microminiaturization is further advanced, since the transistor driving capacity elevates, the output impedances Zr and Zf of the driver circuit 1 in the above equations (1) and (2) become small, however, since Rl and Cl do not become under the scaling principle as mentioned hereinbefore, the values of tpdl(r) and tpdl(f) have the inclination of not substantially changing or rather of increasing. On the other hand, the gate delay becomes small since the transistor driving capacity elevates, namely, in accordance with the scaling principle. As a result, it could be understood from the equations that, an advance of the microminiaturization results in an increased proportion of the wiring delay to the total signal propagation delay.

In brief, most of the prior art CMOS logic circuits has been so constructed that a signal is transferred between a driver circuit and a receiver circuit which have a single logical threshold, as shown in FIG. 1. In this construction, as mentioned above, the active circuit elements themselves elevate their performance and their driving capacity in accordance with the scaling principle. However, since the wiring delay does not accord with the scaling principle, the advance of the microminiaturization rather results in an increased proportion of the wiring delay to the total signal propagation delay.

Additionally, the higher the speed of driving the wiring capacitance of the internal wiring conductor and the input/output node capacitance is made, the larger the voltage fluctuation of the internal power supply line caused by a rising and a falling of the internal signal becomes.

SUMMARY OF THE INVENTION

Accordingly, it is an object of the present invention to provide a CMOS logic LSI having a long internal wiring conductor for an internal signal transmission, which has overcome the above mentioned defects of the conventional one.

Another object of the present invention is to provide a CMOS logic LSI having a long internal wiring conductor for an internal signal transmission, but capable of speeding up the transmission of a signal propagated through the long internal wiring conductor.

Still another object of the present invention is to provide a CMOS logic LSI having a long internal wiring conductor for an internal signal transmission, but capable of minimizing the voltage fluctuation of the internal power supply line caused by a rising and a falling of a signal propagated through the long internal wiring conductor.

The above and other objects of the present invention are achieved in accordance with the present invention by a semiconductor integrated circuit having an internal wiring conductor for transferring an internal signal, the semiconductor integrated circuit comprising:

an intermediate voltage generator for generating an intermediate voltage between a power supply voltage and a ground level;

a driver circuit receiving the intermediate voltage and the internal signal, for generating a positive/negative pulse signal having the intermediate voltage as a reference level, in response to a rising/falling edge of the internal signal, the driver circuit driving the internal wiring conductor with the generated positive/negative pulse signal; and a receiver circuit receiving the positive/negative pulse signal transferred through the internal wiring conductor and having an output which is set and reset in response to the positive/negative pulse signal.

In a preferred embodiment of the semiconductor integrated circuit, the driver circuit comprises:

an edge detector circuit receiving the internal signal, for generating an edge detection signal in the form of a pulse having a constant pulse width in response to each of a rising edge and a falling edge of the internal signal; and a selector circuit receiving the internal signal and the intermediate voltage and controlled by the edge detection signal to output the internal signal during a period of the constant pulse width of the edge detection signal and to output the intermediate voltage during a remaining period other than the period of the constant pulse width of the edge detection signal, so that the positive/negative pulse signal is constituted by the internal signal during the period of the constant pulse width of the edge detection signal and by the intermediate voltage during the remaining period other than the of the constant pulse width of the edge detection signal.

On the other hand, the receiver circuit comprises:

a high threshold circuit receiving the positive/negative pulse signal and having a logical threshold voltage higher than the intermediate voltage;

a low threshold circuit receiving the positive/negative pulse signal and having a logical threshold voltage lower than the intermediate voltage; and a reset/set flipflop set and reset by an output of the high threshold circuit and an output of the low threshold circuit.

Specifically, the high threshold circuit includes a first CMOS inverter composed of a first PMOS transistor and a first NMOS transistor connected in series and having respective gates connected in common to receive the positive/negative pulse signal, common-connected drains of the first PMOS transistor and the first NMOS transistor being connected to a set input of the reset/set flipflop, and a first threshold level setting means connected between a source of the first NMOS transistor and ground, for causing the high threshold circuit to have a logical threshold voltage higher than the intermediate voltage. On the other hand, the low threshold circuit includes a second CMOS inverter composed of a second PMOS transistor and a second NMOS transistor connected in series and having respective gates connected in common to receive the positive/negative pulse signal, common-connected drains of the second PMOS transistor and the second NMOS transistor being connected to a reset input of the reset/set flipflop, and a second threshold level setting means connected between a source of the second PMOS transistor and the power supply voltage, for causing the low threshold circuit to have a logical threshold voltage lower than the intermediate voltage.

More specifically, the first threshold level setting means is composed of a third NMOS transistor having a gate and a drain connected in common to the source of the first NMOS transistor and a source connected to the ground, and the second threshold level setting means is composed of a third PMOS transistor having a gate and a drain connected in common to the source of the second PMOS transistor and a source connected to the power supply voltage.

For example, the intermediate voltage is equal to a half of the power supply voltage.

The above and other objects, features and advantages of the present invention will be apparent from the following description of preferred embodiments of the invention with reference to the accompanying drawings.

BRIEF DESCRIPTION OF THE DRAWINGS

FIG. 3B is a waveform diagram for illustrating an operation of the driver circuit shown in FIG. 3A;

DESCRIPTION OF THE PREFERRED EMBODIMENTS

Figure 1:
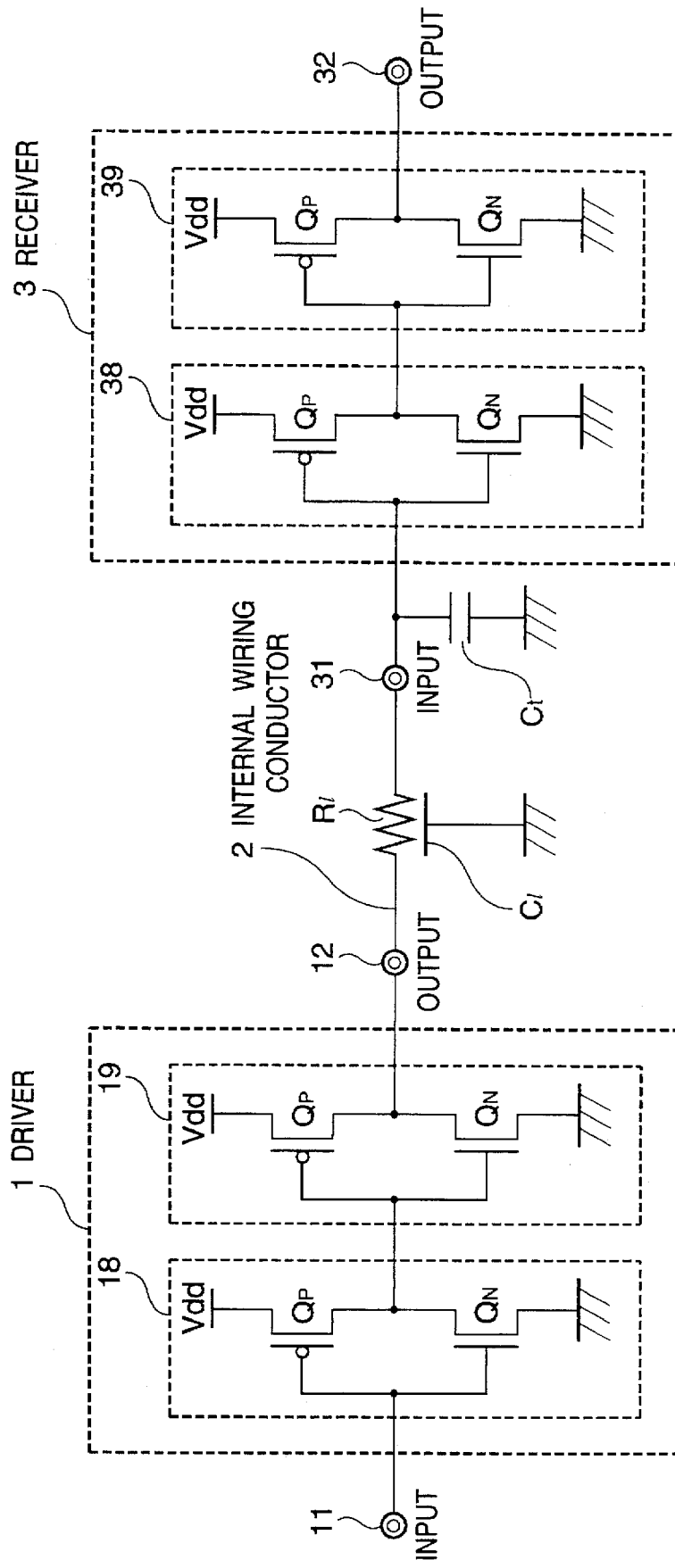
FIG. 1 is a circuit diagram of a signal transmission circuit in a prior art CMOS logic circuit.
Figure 2:
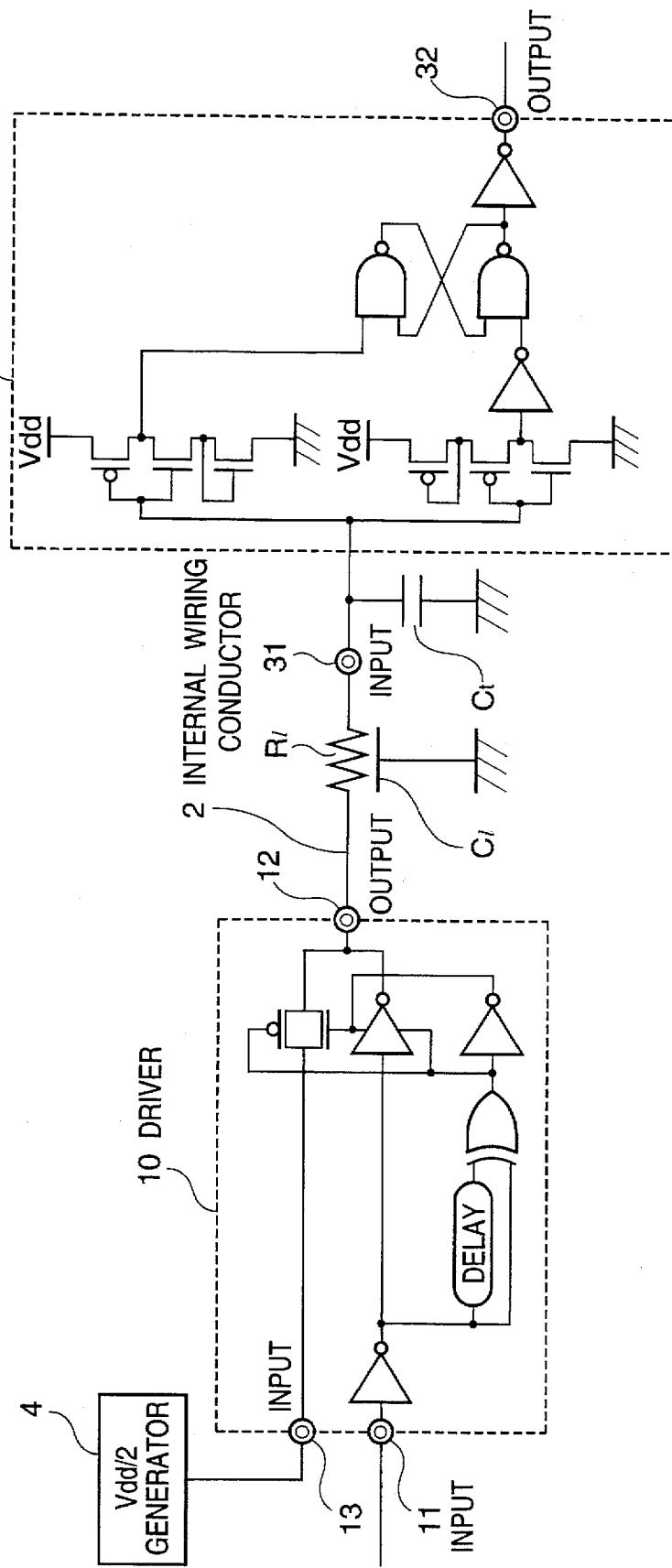
FIG. 2 is a circuit diagram of one embodiment of a signal transmission circuit of the semiconductor integrated circuit in accordance with the present invention.

Referring to FIG. 2, there is shown a circuit diagram of one embodiment of a signal transmission circuit of the semiconductor integrated circuit in accordance with the present invention. In FIG. 2, elements similar to those shown in FIG. 1 are given the same Reference Numerals, and explanation thereof will be omitted for simplification of description.

For the purpose of transmitting an internal signal through a long internal wiring conductor 2, the shown signal transmission circuit includes an intermediate voltage generator 4 for generating an intermediate voltage between the power supply voltage Vdd and the ground level, which is for example a half of the power supply voltage Vdd, a driver circuit 10 receiving an input signal supplied to an input node 11 for generating an positive/negative pulse signal having the intermediate voltage as a reference voltage, in response to a rising edge and a falling edge of the received internal signal, and for driving the wiring conductor 2 by the generated positive/negative pulse signal, and a receiver circuit 30 receiving the positive/negative pulse signal and an output which is set or reset in response to the positive/negative pulse signal. In the shown signal transmission circuit, the driver circuit 10 and the receiver circuit 30 are a featured portion of the semiconductor integrated circuit in accordance with the present invention.

Figure 3A:
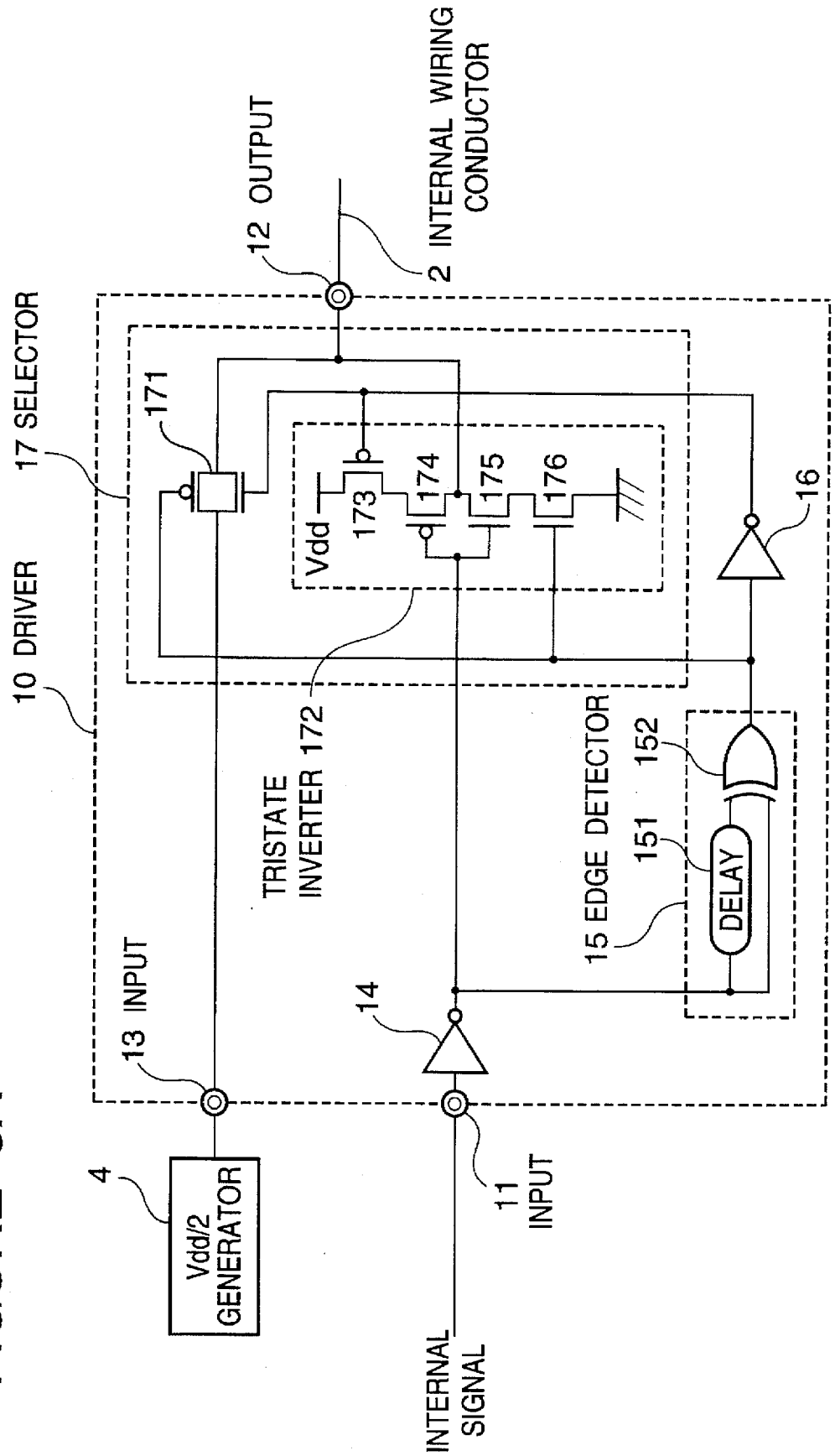
FIG. 3A is a detailed circuit diagram of the driver circuit incorporated in the signal transmission circuit shown in FIG. 2.

Referring to FIG. 3A, there is shown a circuit diagram of the driver circuit 10 incorporated in the signal transmission circuit shown in FIG. 2.

As shown in FIG. 3A, the driver circuit 10 has the input node 11 for receiving an input signal, another input node 13 for receiving the intermediate voltage Vdd/2 from the intermediate voltage generator 4, and an output node 12 for outputting a signal to be transmitted to the receiver circuit 30. The driver circuit 10 comprises an inverter 14 having an input connected to the input node 11, an edge detector circuit 15 having an input connected to an output of the inverter 14, another inverter 16 having an input connected to an output of the edge detector circuit 15, and a selector circuit 17 having a first input connected to the output of the inverter 14 and a second input connected to the input node 13, and controlled by the output of the edge detector circuit 15 and an output of the inverter 16 so as to output a selected one to the output node 12.

The edge detector circuit 15 includes a delay circuit 151 having an input connected to the output of the inverter 14 for outputting a delayed signal which is obtained by delaying an output signal of the inverter 14 by a predetermined constant time, and an exclusive OR circuit 152 having a first input connected to receive the delayed signal outputted from the delay circuit 151 and a second input connected to the output of the inverter 14, for generating an edge detection signal having a constant pulse width corresponding to the delay time of the delay circuit 151.

The selector circuit 17 comprises a transfer gate 171 and a tristate inverter 172 which are controlled by the edge detection signal outputted from the edge detector circuit 15 and the output of the inverter 16.

The transfer gate 171 is composed of a pair of NMOS transistor and PMOS transistor connected in parallel, as well known in the art, and is connected between the input node 13 and the output node 12. A gate of the PMOS transistor of the transfer gate 171 is connected to the output of the edge detector circuit 15, and a gate of the NMOS transistor of the transfer gate 171 is connected to the output of the inverter 16. Therefore, when the output of the edge detector circuit 15 is at a low level, namely, during a period other than the pulse width of the edge detection signal, the transfer gate 171 is maintained in a conductive condition, so that the intermediate voltage Vdd/2 is supplied from the input node 13 through the transfer gate 171 to the output node 12 so as to drive the internal wiring conductor 2. When the output of the edge detector circuit 15 is at a high level, namely, during a period of the pulse width of the edge detection signal, the transfer gate 171 is maintained in a non-conductive condition, so that the intermediate voltage Vdd/2 is not supplied to the output node 12.

The tristate inverter 171 includes two PMOS transistors 173 and 174 and two NMOS transistors 175 and 176 which are connected in series between the power supply voltage Vdd and ground in the named order. Respective gates of the PMOS transistor 174 and the NMOS transistor 175 are connected in common to receive the output of the inverter 14, and common-connected drains of the PMOS transistor 174 and the NMOS transistor 175 are connected to the output node 12. A gate of the PMOS transistor 173 is connected to the output of the inverter 16, and a gate of the NMOS transistor 176 is connected to the output of the edge detector circuit 15. Therefore, when the output of the edge detector circuit 15 is at the high level, namely, during the period of the pulse width of the edge detection signal, the MOS transistors 173 and 176 are turned on, and therefore, the tristate inverter 172 acts an inverter so that the internal signal supplied to the input node 11 is outputted from the output node 12 through the inverter 14 and the tristate inverter 172. On the other hand, when the output of the edge detector circuit 15 is at the low level, namely, during the period other than the pulse width of the edge detection signal, the MOS transistors 173 and 176 are turned off, and therefore, the output of the tristate inverter 172 is maintained in a high impedance condition.

Now, an operation of the driver circuit 1 will be described simply with reference to FIG. 3B, which is a waveform diagram for illustrating an operation of the driver circuit shown in FIG. 3A. When the internal signal as shown in an upper half of FIG. 3B supplied to the input node 11 changes its level, the edge detector circuit 15 generates the edge detection signal having the pulse width corresponding to the delay time of the delay circuit 151, in response to each of the rising edge and the falling edge of the internal signal. In the selector circuit 17, on the other hand, during the pulse width period of the edge detection signal, the internal signal supplied through the inverter 14 is selected, and during the period other than the pulse width period of the edge detection signal, the intermediate voltage is selected. Thus, the positive/negative pulse signal having the intermediate voltage Vdd/2 as a reference level, as shown in a lower half of FIG. 3B, is outputted from the output node 12 to the internal wiring conductor 2 in response to each of the rising edge and the falling edge of the internal signal supplied to the input node 11. Specifically, the positive pulse signal having the intermediate voltage Vdd/2 as the reference level, is outputted in response to the rising edge of the internal signal, and the negative pulse signal having the intermediate voltage Vdd/2 as the reference level, is outputted in response to the falling edge of the internal signal.

Figure 4A:
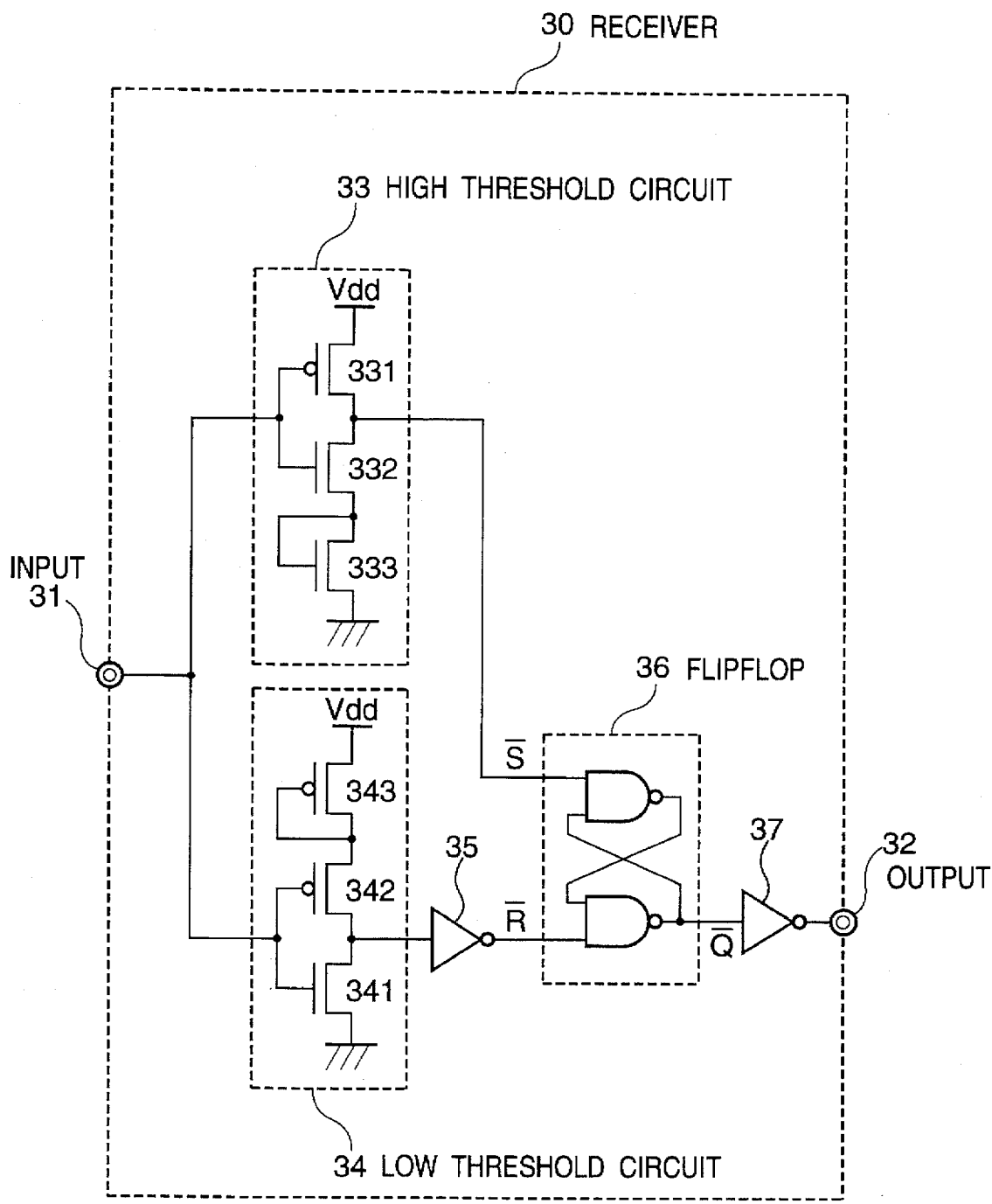
FIG. 4A is a detailed circuit diagram of the receiver circuit incorporated in the signal transmission circuit shown in FIG. 2.

Now, referring to FIG. 4A, there is shown a circuit diagram of the receiver circuit 30 incorporated in the signal transmission circuit shown in FIG. 2.

The receiver circuit 30 has the input node 31 for receiving through the internal wiring conductor 2 the positive/negative pulse signal having the intermediate voltage Vdd/2 as the reference level, and the output node 32 for outputting the internal signal which has been restored on the basis of the received positive/negative pulse signal and which is in the same phase as that of the internal signal supplied to the input node 11 of the driver circuit 10.

For this purpose, the receiver circuit 30 includes a high threshold inverter circuit 33 having an input connected to the input node 31 to receive the positive/negative pulse signal and having a logical threshold level higher than the intermediate voltage Vdd/2, a low threshold inverter circuit 34 having an input connected to the input node 31 to receive the positive/negative pulse signal and having a logical threshold level lower than the intermediate voltage Vdd/2, a RS (reset/set) flipflop 36 having a negative logic set input $\overline{S}$ connected to an output of the high threshold inverter circuit 33, and a negative logic reset input $\overline{R}$ connected through an inverter 35 to an output of the low threshold inverter circuit 34, and another inverter 37 having an input connected to an inverted output $\overline{Q}$ of the RS flipflop 36 and an output connected to the output node 32.

More specifically, the high threshold inverter circuit 33 includes a PMOS transistor 331 and two NMOS transistors 332 and 333 connected in series between the power supply voltage Vdd and the ground in the named order. Gates of the PMOS transistor 331 and the NMOS transistor 332 are connected in common to the input node 31 so as to receive the positive/negative pulse signal. Common-connected drains of the PMOS transistor 331 and the NMOS transistor 332 are connected to the negative logic set input $\overline{S}$ of the RS flipflop 36. Namely, the PMOS transistor 331 and the NMOS transistor 332 constitute a CMOS inverter. The NMOS transistor 333 has a gate and a drain connected to each other to assume the form of an active load. This NMOS transistor 333 constitutes a first logical threshold setting means connected between the source of the NMOS transistor 332 of the CMOS inverter and the ground, for making a logical threshold of the CMOS inverter constituted of the PMOS transistor 331 and the NMOS transistor 332, higher than the intermediate voltage Vdd/2.

On the other hand, the low threshold inverter circuit 34 includes two PMOS transistors 343 and 342 and one NMOS transistor 341 connected in series between the power supply voltage Vdd and the ground in the named order. Gates of the PMOS transistor 342 and the NMOS transistor 341 are connected in common to the input node 31 so as to receive the positive/negative pulse signal. Common-connected drains of the PMOS transistor 342 and the NMOS transistor 341 are connected to an input of the inverter 35 having an output connected to the negative logic reset input $\overline{R}$ of the RS flipflop 36. Namely, the PMOS transistor 342 and the NMOS transistor 341 constitute a CMOS inverter. The NMOS transistor 343 has a gate and a drain connected to each other to assume the form of an active load. This PMOS transistor 343 constitutes a second logical threshold setting means connected between the power supply voltage Vdd and the source of the PMOS transistor 342 of the CMOS inverter, for making a logical threshold of the CMOS inverter constituted of the PMOS transistor 342 and the NMOS transistor 341, lower than the intermediate voltage Vdd/2.

Next, a logical threshold voltage of each of the high threshold inverter circuit 33 and the low threshold inverter circuit 34 will be described in detail.

In a general CMOS inverter circuit, when the potential of the input is caused to elevate from the ground level, the potential of the output changes from a high level to a low level. For this purpose, it is necessary to create such a relation that an impedance of the power supply viewed from the output terminal is larger than an impedance of the ground viewed from the output terminal. On the other hand, when the potential of the input is caused to drop from the power supply voltage level, the potential of the output changes from the low level to the high level. For this purpose, it is necessary to create such a relation that the impedance of the power supply viewed from the output terminal is smaller than the impedance of the ground viewed from the output terminal.

In the case of the high threshold inverter circuit 33, the impedance of the power supply viewed from the output terminal is substantially determined by a channel resistance of the PMOS transistor 331, and the impedance of the ground viewed from the output terminal is determined by a series-synthesized resistance of respective channel resistances of the two NMOS transistors 332 and 333. Comparing this high threshold inverter circuit 33 with a conventional CMOS inverter composed of only one PMOS transistor and one NMOS transistor (for example only the PMOS transistor 331 and the NMOS transistor 332) under the condition of the same input voltage, the impedance of the power supply viewed from the output terminal is similar to that of the conventional CMOS inverter, but the impedance of the ground viewed from the output terminal is clearly larger than that of the conventional CMOS inverter, because of the action of the NMOS transistor 333 having the gate and the drain connected to each other to form an active load. Accordingly, a large-and-small relation between the impedance of the power supply viewed from the output terminal and the impedance of the ground viewed from the output terminal, changes with the input voltage which is higher than the input voltage which causes to change, in the conventional CMOS inverter, the large-and-small relation between the impedance of the power supply viewed from the output terminal and the impedance of the ground viewed from the output terminal. Namely, the logic threshold voltage of the high threshold inverter circuit 33 becomes higher than that of the conventional CMOS inverter.

On the other hand, in the case of the low threshold inverter circuit 34, the impedance of the power supply viewed from the output terminal is substantially determined by a series-synthesized resistance of respective channel resistances of the two PMOS transistors 342 and 343, and the impedance of the ground viewed from the output terminal is determined by a channel resistance of the NMOS transistor 341. Comparing this low threshold inverter circuit 33 with the conventional CMOS inverter under the condition of the same input voltage, the impedance of the ground viewed from the output terminal is similar to that of the conventional CMOS inverter, but the impedance of the power supply viewed from the output terminal is clearly larger than that of the conventional CMOS inverter, because of the action of the PMOS transistor 343 having the gate and the drain connected to each other to form an active load. Accordingly, a large-and-small relation between the impedance of the power supply viewed from the output terminal and the impedance of the ground viewed from the output terminal, changes with the input voltage which is lower than the input voltage which causes to change, in the conventional CMOS inverter, the large-and-small relation between the impedance of the power supply viewed from the output terminal and the impedance of the ground viewed from the output terminal. Namely, the logic threshold voltage of the low threshold inverter circuit 34 becomes lower than that of the conventional CMOS inverter.

Figure 4B:
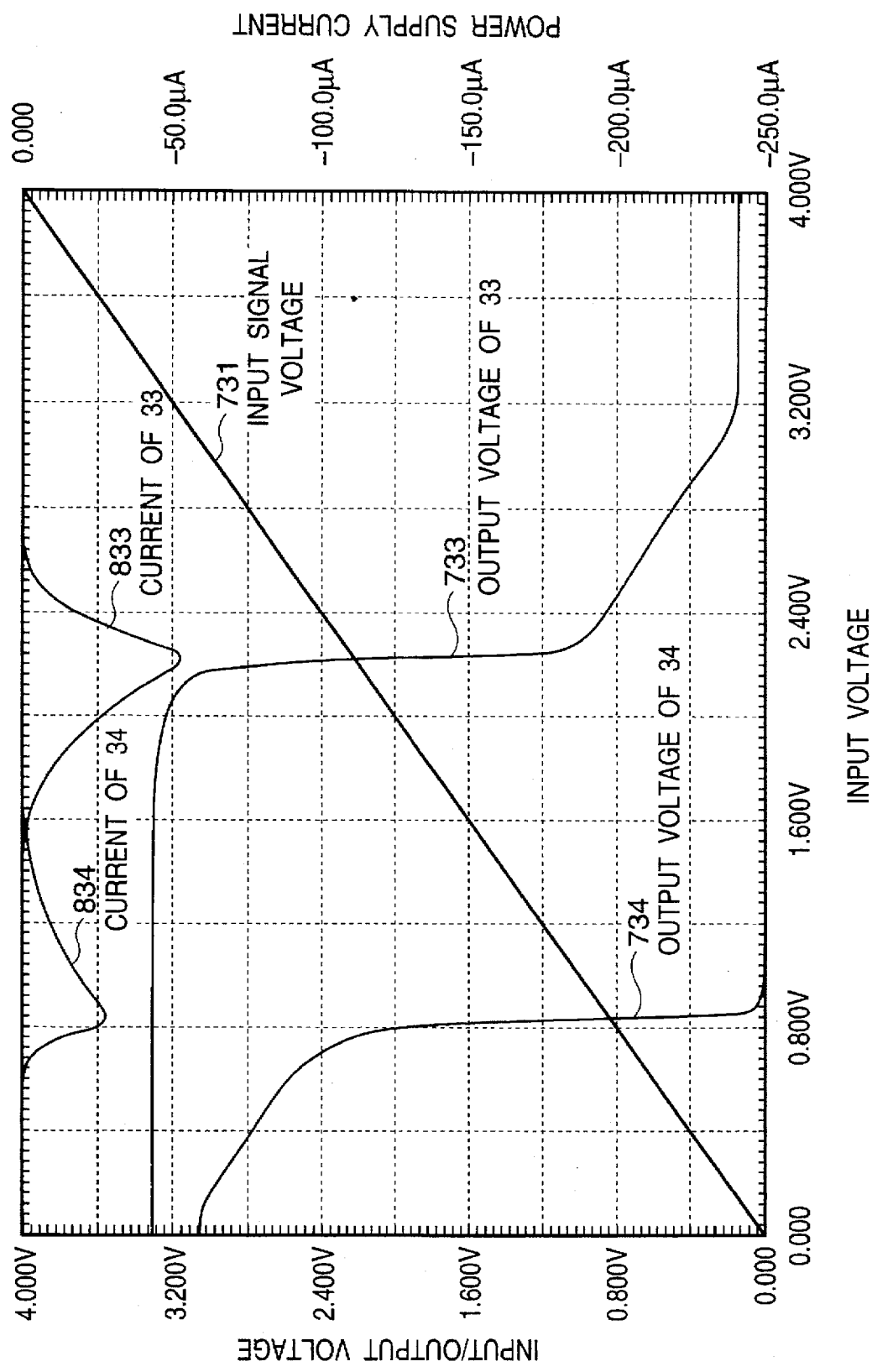
FIG. 4B is a waveform diagram for illustrating an operation of the receiver circuit shown in FIG. 4A.

Referring to FIG. 4B, there is shown a waveform diagram for illustrating an input/output voltage characteristics and a current characteristics of the high threshold inverter circuit 33 and the low threshold inverter circuit 34 included in the receiver circuit 30 shown in FIG. 4A. The shown waveform diagram is a DC analysis result based on a circuit simulation of the high threshold inverter circuit 33 and the low threshold inverter circuit 34. In FIG. 4B, the axis of abscissas shows an input voltage, and a left side axis of ordinates shows an input/output voltage and a right side axis of ordinates shows a power supply current. The curved line 731 indicates the voltage of the input signal supplied to the input node 31 of the receiver circuit 30. The curved line 733 indicates the voltage of the output of the high threshold inverter circuit 33, and the curved line 734 indicates the voltage of the output of the low threshold inverter circuit 34. The curved line 833 shows a power supply current characteristics of the high threshold inverter circuit 33, and the curved line 834 shows a power supply current characteristics of the low threshold inverter circuit 34.

This circuit simulation was conducted under the condition that: A gate length L of all the transistors is 0.5 μm. Gate width of the PMOS transistors 331, 342 and 343 are 10 μm, 5 μm and 5 μm, respectively. Gate width of the NMOS transistors 332, 333 and 341 are 5 μm, 5 μm and 10 μm, respectively. The threshold Vtn of all the NMOS transistors is 0.6 V, and the threshold Vtp of all the PMOS transistors is −0.6 V. The power supply voltage Vdd is 3.3 V.

From the output voltage line 733, it would be seen that the logical threshold voltage of the high threshold inverter circuit 33 is about 2.2 V.

On the other hand, from the output voltage line 734, it would be seen that logical threshold voltage of the low threshold inverter circuit 34 is about 0.8 V. Examining the power supply current curved lines 833 and 834, in the neighborhood of a half of the power supply voltage Vdd (=1.65 V), the current value is almost zero, and therefore, a so called "shoot-through" current does not occur. This is because the NMOS transistor 333 having the gate and the drain connected to each other functions as a current limiter in the high threshold inverter circuit 33 and because the PMOS transistor 343 having the gate and the drain connected to each other functions as a current limiter in the low threshold inverter circuit 34.

Thus, this receiver circuit 30 is featured in that, when the positive/negative pulse signal is applied, one of the high threshold inverter circuit 33 and the low threshold inverter circuit 34 flips its output voltage signal but the other does not flip its output voltage signal, so that the flipped output voltage signal and the non-flipped output voltage signal are supplied to the RS flipflop 36. Therefore, the receiver circuit 30 constitutes a Schmidt buffer circuit having two logical threshold voltages and causing no "shoot-through" current even if a half of the power supply voltage is applied to the input.

Next, an action and operation of the semiconductor integrated circuit of this embodiment will be described with reference to FIG. 2, again.

Assuming that the input signal shown in the upper half of FIG. 3B is supplied to the input node 11 of the driver circuit 10, the output signal as shown in the low half of FIG. 3B (namely, the positive/negative pulse signal) is outputted from the output node 12 of the driver circuit 10.

Now, assume that the power supply voltage is Vdd, an output impedance of the driver circuit 10 is Zr (at rising) and Zf (at falling), the wiring resistance of the wiring conductor 2 is Rl, the wiring capacitance of the wiring conductor 2 is Cl, the input node capacitance of the receiver circuit 30 is Ct, and the two logical threshold voltages of the receiver circuit 30 are VtH and VtL (VtH >VtL). Under this condition, when the receiver circuit 30 is driven with the positive/negative pulse signal as shown in the low half of FIG. 3B, wiring delays tpdl(r) (at rising) and tpdl(f) (at falling) are expressed by the following equations (3) and (4), respectively.

$$tpdl(r)=\ln\{0.5\times Vdd/(Vdd-VtH)\}\times\{Zr\times Cl+Rl\times(0.5\times Cl+Ct)\} \quad (3)$$

$$tpdl(f)=\ln(0.5\times Vdd/VtL)\times\{Zf\times Cl+Rl\times(0.5\times Cl+Ct)\} \quad (4)$$

Here, similarly to the prior art CMOS logic circuit example, considering a CMOS process of a gate length of 0.5 μm, which is the present mass production rule, it is assumed that the capacitance per unitary length "C"=0.2 pF/mm, and the resistance per unitary length "R"=50 Ω/mm, the power supply voltage Vdd=3.3 V, the driver circuit output impedance Zr=Zf=400Ω, and also it is assumed that the two logical threshold voltages VtH and VtL of the receiver circuit 30 are 2.2 V and 0.8 V, respectively, and the receiver circuit input node capacitance Ct=20 fF. Under this condition, if the wiring delay is calculated in the case of the wiring conductor length=3 mm in accordance with the equations (3) and (4), it becomes tpdl(r)=0.12 ns and tpdl(f)=0.21 ns. Similarly, letting the wiring conductor length= 10 mm, it becomes tpdl(r)=0.55 ns and tpdl(f)=0.98 ns.

Accordingly, by using the receiver circuit 30 having the two different logical threshold voltages, it is possible to reduce the wiring delay. The longer the wiring conductor length becomes, the more this advantage becomes remarkable.

Furthermore, even if the half voltage of the power supply voltage is applied to the receiver circuit 30 having the two different logical threshold voltages, almost no shoot-through current occurs in the receiver circuit 30. Therefore, since the positive/negative pulse signal having the half voltage of the power supply voltage as the reference voltage is supplied from the driver circuit 10 to the receiver circuit 30, a consumed current does not increase in a steady condition.

As mentioned above, the semiconductor integrated circuit in accordance with the present invention is characterized in that, in order to transfer an internal signal through a long internal wiring conductor, the driver circuit is configured to output onto the internal wring conductor the positive/ negative pulse signal which is generated in response to each of the rising edge and the falling edge of the internal signal and which has as the reference voltage an intermediate voltage between the power supply voltage and the ground level, and on the other hands the receiver circuit receiving the positive/negative pulse signal transferred through the internal wiring conductor, comprises the Schmidt circuit configured to have the two different logical threshold voltages and to have the output which is set and reset in response to the positive/negative pulse signal.

Therefore, the wiring delay due to the internal wiring conductor can be reduced with no increase of the shoot-through current at the intermediate voltage. The longer the wiring conductor length becomes, the more this advantage becomes remarkable, so that the signal transmission through the internal wiring conductor can be speeded up.

Furthermore, the current for charging and discharging the wiring capacitance of the internal wiring conductor and the input node capacitance is flowed from the intermediate voltage between the power supply voltage and the ground level, as the reference level, and in response to each of the rising edge and the falling edge of the positive/negative pulse signal. Therefore, the charging/discharging current is distributed and also reduced in amplitude. As a result, when the internal wiring conductor is driven, the voltage fluctuation of the internal power supply line is minimized.

The invention has thus been shown and described with reference to the specific embodiments. However, it should be noted that the present invention is in no way limited to the details of the illustrated structures but changes and modifications may be made within the scope of the appended claims.

I claim:

1. A semiconductor integrated circuit having an internal wiring conductor for transferring an internal signal, the semiconductor integrated circuit comprising:

an intermediate voltage generator for generating an intermediate voltage between a power supply voltage and a ground level;

a driver circuit receiving said intermediate voltage and said internal signal, for generating a positive pulse signal having said intermediate voltage as a reference level, and a first width in response to a rising edge of said internal signal, for generating a negative pulse signal having said intermediate voltage as a reference level, and said first width in response to a falling edge of said internal signal, and for selecting said intermediate voltage when positive/negative pulse is not generated, said driver circuit driving said internal wiring conductor with the generated positive/negative pulse signal; and a receiver circuit receiving said positive/negative pulse signal transferred through said internal wiring conductor and having an output which is set and reset in response to said positive/negative pulse signal.

2. A semiconductor integrated circuit claimed in claim 1 wherein said driver circuit comprises:

an edge detector circuit receiving said internal signal, for generating an edge detection signal in the form of said positive/negative pulse having a constant pulse width in response to each of a rising edge and a falling edge of said internal signal; and a selector circuit receiving said internal signal and said intermediate voltage and controlled by said edge detection signal to output said internal signal during a period of said constant pulse width of said edge detection signal and to output said intermediate voltage during a remaining period other than the period of said constant pulse width of said edge detection signal, so that said positive/negative pulse signal constituted by said internal signal during said period of said constant pulse width of said edge detection signal and by said intermediate voltage during said remaining period other than the said of said constant pulse width of said edge detection signal.

3. A semiconductor integrated circuit claimed in claim 2 wherein said receiver circuit comprises:

a high threshold circuit receiving said positive/negative pulse signal and having a logical threshold voltage higher than said intermediate voltage;

a low threshold circuit receiving said positive/negative pulse signal and having a logical threshold voltage lower than said intermediate voltage; and a reset/set flipflop set and reset by an output of said high threshold circuit and an output of said low threshold circuit.

4. A semiconductor integrated circuit claimed in claim 3 wherein said high threshold circuit includes a first CMOS inverter composed of a first PMOS transistor and a first NMOS transistor connected in series and having respective gates connected in common to receive said positive/negative pulse signal, common-connected drains of said first PMOS transistor and said first NMOS transistor being connected to a set input of said reset/set flipflop, and a first threshold level setting means connected between a source of said first NMOS transistor and ground, for causing said high threshold circuit to have a logical threshold voltage higher than said intermediate voltage; and wherein said low threshold circuit includes a second CMOS inverter composed of a second PMOS transistor and a second NMOS transistor connected in series and having respective gates connected in common to receive said positive/negative pulse signal, common-connected drains of said second PMOS transistor and said second NMOS transistor being connected to a reset input of said reset/set flipflop, and a second threshold level setting means connected between a source of said second PMOS transistor and said power supply voltage, for causing said low threshold circuit to have a logical threshold voltage lower than said intermediate voltage.

5. A semiconductor integrated circuit claimed in claim 4 wherein said first threshold level setting means is composed of a third NMOS transistor having a gate and a drain connected in common to said source of said first NMOS transistor and a source connected to the ground, and said second threshold level setting means is composed of a third PMOS transistor having a gate and a drain connected in common to said source of said second PMOS transistor and a source connected to said power supply voltage.

6. A semiconductor integrated circuit claimed in claim 1 wherein said intermediate voltage is equal to a half of said power supply voltage.

7. A semiconductor integrated circuit claimed in claim 2 wherein said intermediate voltage is equal to a half of said power supply voltage.

8. A semiconductor integrated circuit claimed in claim 3 wherein said intermediate voltage is equal to a half of said power supply voltage.

9. A semiconductor integrated circuit claimed in claim 1 wherein said receiver circuit comprises:

a high threshold circuit receiving said positive/negative pulse signal and having a logical threshold voltage higher than said intermediate voltage;

a low threshold circuit receiving said positive/negative pulse signal and having a logical threshold voltage lower than said intermediate voltage; and a reset/set flipflop set and reset by an output of said high threshold circuit and an output of said low threshold circuit.

10. A semiconductor integrated circuit claimed in claim 9 wherein said high threshold circuit includes a first CMOS inverter composed of a first PMOS transistor and a first NMOS transistor connected in series and having respective gates connected in common to receive said positive/negative pulse signal, common-connected drains of said first PMOS transistor and said first NMOS transistor being connected to a set input of said reset/set flipflop, and a first threshold level setting means connected between a source of said first NMOS transistor and ground, for causing said high threshold circuit to have a logical threshold voltage higher than said intermediate voltage; and wherein said low threshold circuit includes a second CMOS inverter composed of a second PMOS transistor and a second NMOS transistor connected in series and having respective gates connected in common to receive said positive/negative pulse signal, common-connected drains of said second PMOS transistor and said second NMOS transistor being connected to a reset input of said reset/set flipflop, and a second threshold level setting means connected between a source of said second PMOS transistor and said power supply voltage, for causing said low threshold circuit to have a logical threshold voltage lower than said intermediate voltage.

11. A semiconductor integrated circuit claimed in claim 10 wherein said first threshold level setting means is composed of a third NMOS transistor having a gate and a drain connected in common to said source of said first NMOS transistor and a source connected to the ground, and said second threshold level setting means is composed of a third PMOS transistor having a gate and a drain connected in common to said source of said second PMOS transistor and a source connected to said power supply voltage.

12. A semiconductor integrated circuit claimed in claim 9 wherein said intermediate voltage is equal to a half of said power supply voltage.

* * * * *